(12) United States Patent
Cho

(10) Patent No.: US 11,823,940 B2
(45) Date of Patent: Nov. 21, 2023

(54) ELECTROSTATIC CHUCK AND MANUFACTURING METHOD THEREFOR

(71) Applicant: Applied Materials, Inc., Santa Clara, CA (US)

(72) Inventor: Saeng Hyun Cho, Gyeonggi-do (KR)

(73) Assignee: Applied Matierals, Inc., Santa Clara, CA (US)

( * ) Notice: Subject to any disclaimer, the term of this patent is extended or adjusted under 35 U.S.C. 154(b) by 817 days.

(21) Appl. No.: 16/304,065

(22) PCT Filed: Jun. 1, 2016

(86) PCT No.: PCT/KR2016/005797
§ 371 (c)(1),
(2) Date: Oct. 22, 2020

(87) PCT Pub. No.: WO2017/209325
PCT Pub. Date: Dec. 7, 2017

(65) Prior Publication Data
US 2021/0057257 A1 Feb. 25, 2021

(51) Int. Cl.
*H01T 23/00* (2006.01)
*H01L 21/683* (2006.01)
*C04B 41/45* (2006.01)
*C04B 41/87* (2006.01)
(Continued)

(52) U.S. Cl.
CPC ...... *H01L 21/6833* (2013.01); *C04B 41/4527* (2013.01); *C04B 41/87* (2013.01); *H01L 21/68757* (2013.01); *H02N 13/00* (2013.01)

(58) Field of Classification Search
None
See application file for complete search history.

(56) References Cited

U.S. PATENT DOCUMENTS 6,188,564 B1 * 2/2001 Hao ........................ H01L 22/20
257/E21.525
2002/0134511 A1 9/2002 Ushioda et al.
(Continued)

FOREIGN PATENT DOCUMENTS

JP 2004260201 A 9/2004
JP 201395992 A 5/2013
(Continued)

OTHER PUBLICATIONS

Japanese Office Action dated Jan. 14, 2020 for Application No. 2018-563109.
(Continued)

*Primary Examiner* — Stephen W Jackson
(74) *Attorney, Agent, or Firm* — Patterson + Sheridan, LLP

(57) ABSTRACT

The present invention relates to a method for manufacturing an electrostatic chuck comprising: a base member of a metal material; and a dielectric layer, formed on an upper surface of the base member, including an electrode layer to the inside of which a DC power is applied. According to the present invention, the dielectric layer is formed of a ceramic material by using at least one selected from among a plasma spraying method and a sol-gel method, and thus can be provided with low porosity to increase in lifespan, and with high permittivity to increase in adhesion force to a substrate.

13 Claims, 8 Drawing Sheets

(51) Int. Cl.
*H01L 21/687* (2006.01)
*H02N 13/00* (2006.01)

(56) References Cited

U.S. PATENT DOCUMENTS

| | | | | |
|---|---|---|---|---|
| 2004/0040665 | A1* | 3/2004 | Mizuno | H02N 13/00 |
| | | | | 118/728 |
| 2007/0253138 | A1* | 11/2007 | Fujii | H01L 21/6833 |
| | | | | 361/234 |
| 2009/0040681 | A1* | 2/2009 | Fujisawa | H02N 13/00 |
| | | | | 361/234 |
| 2014/0199808 | A1 | 7/2014 | Sugimoto et al. | |

FOREIGN PATENT DOCUMENTS

| | | | |
|---|---|---|---|
| JP | 2013163837 A | 8/2013 | |
| JP | 2013-258429 A | 12/2013 | |
| JP | 2016503962 A | 2/2016 | |
| KR | 20120120415 A | 11/2012 | |
| KR | 2013-0110091 A | 10/2013 | |
| KR | 2015-0088699 A | 8/2015 | |
| KR | 2015-0136483 A | 12/2015 | |
| WO | 2014099559 A1 | 6/2014 | |

OTHER PUBLICATIONS

International Search Report and Written Opinion dated Feb. 13, 2017 dated Feb. 13, 2017 for Application No. PCT/KR2016/005797.

* cited by examiner

[Fig. 1]
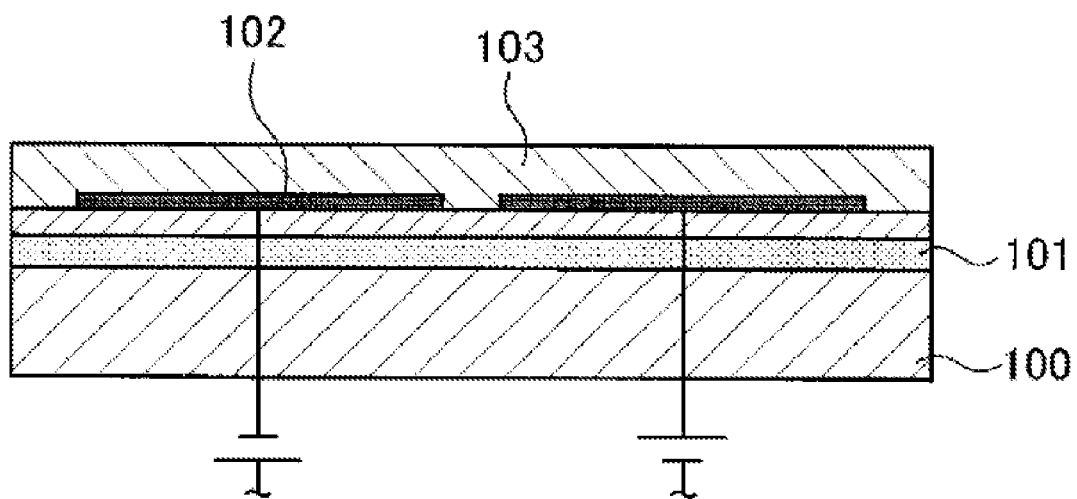

[Fig. 2A]
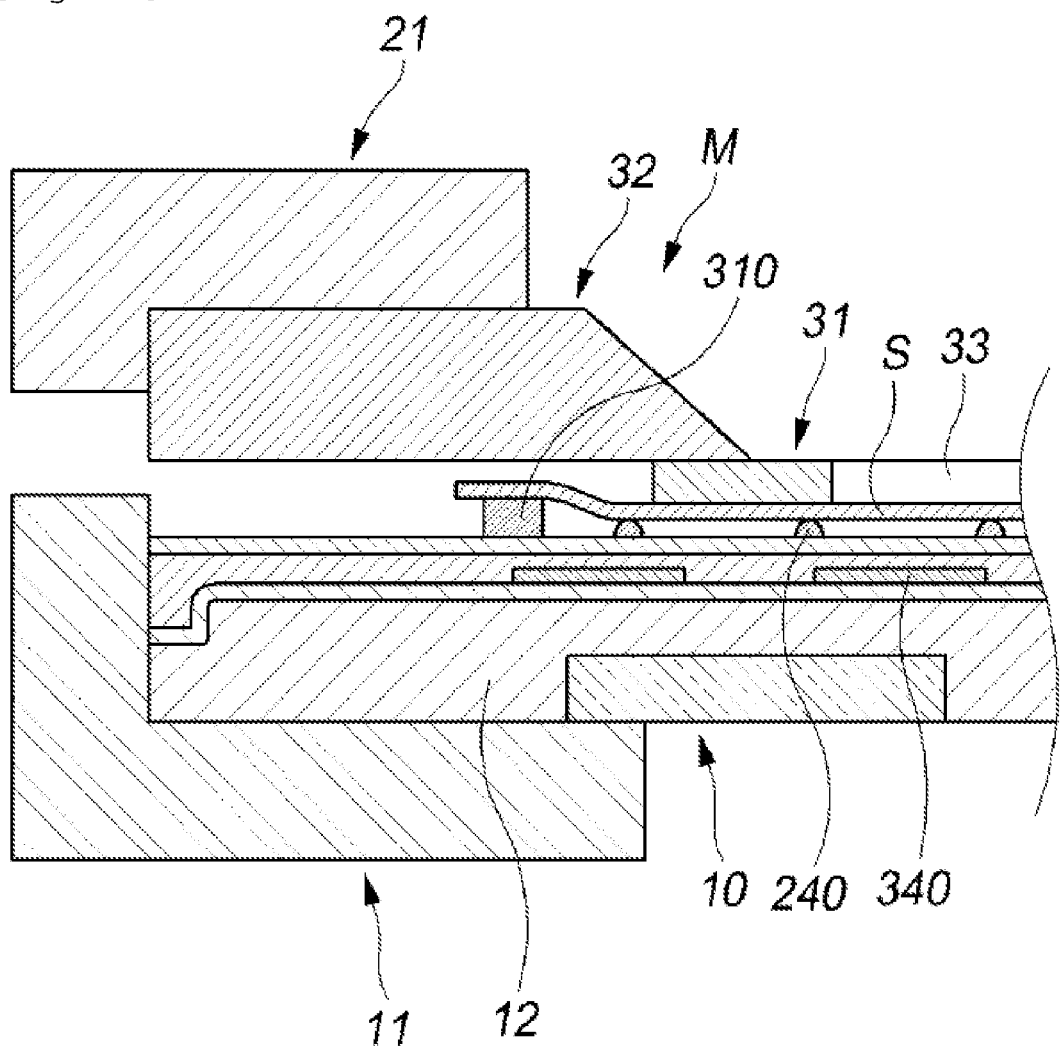

[Fig. 2B]
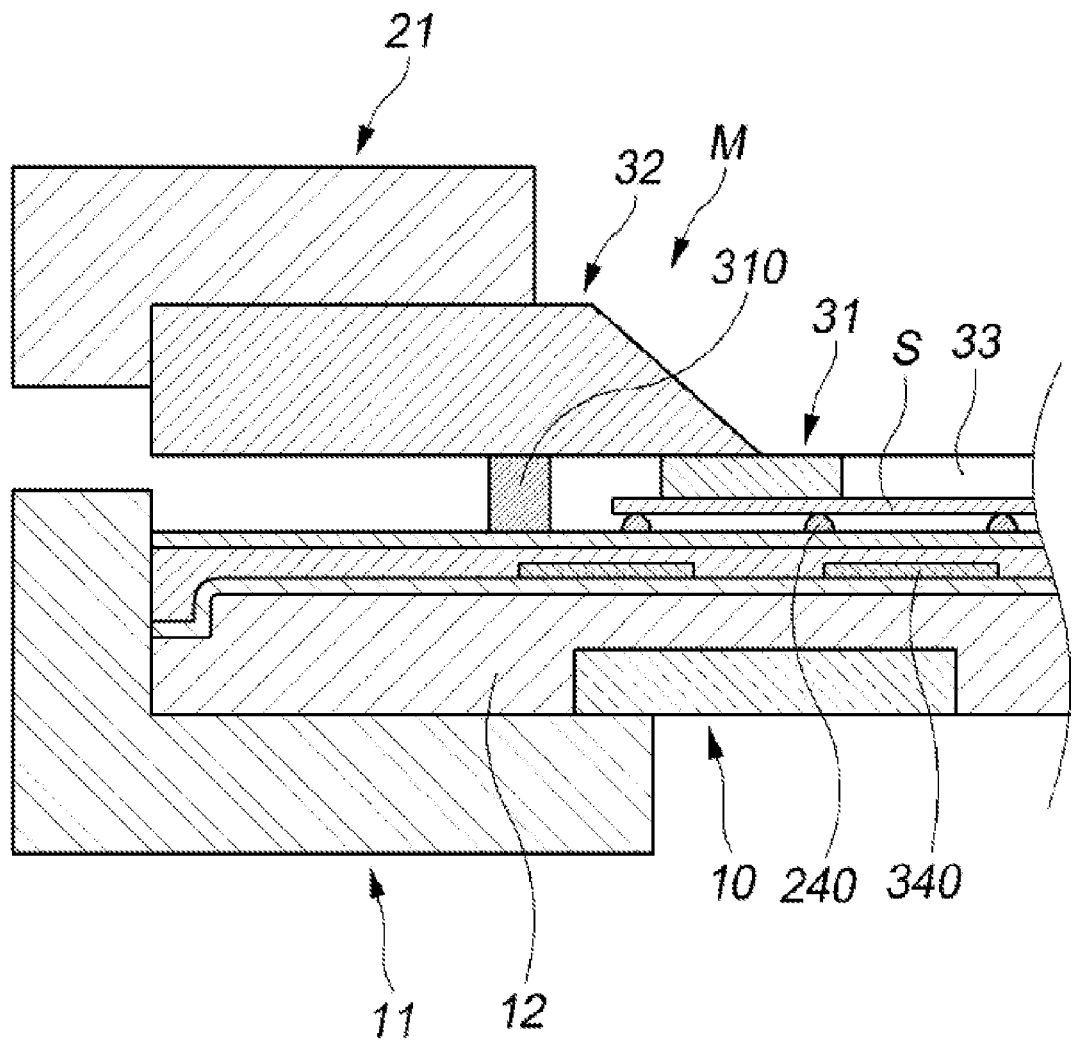

[Fig. 3]
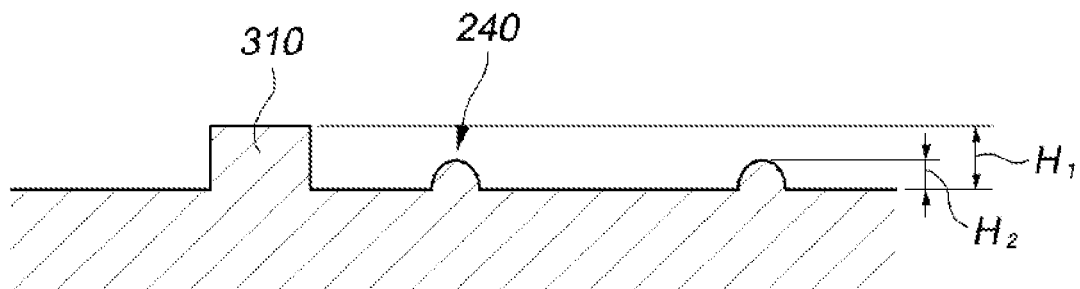
[Fig. 4]
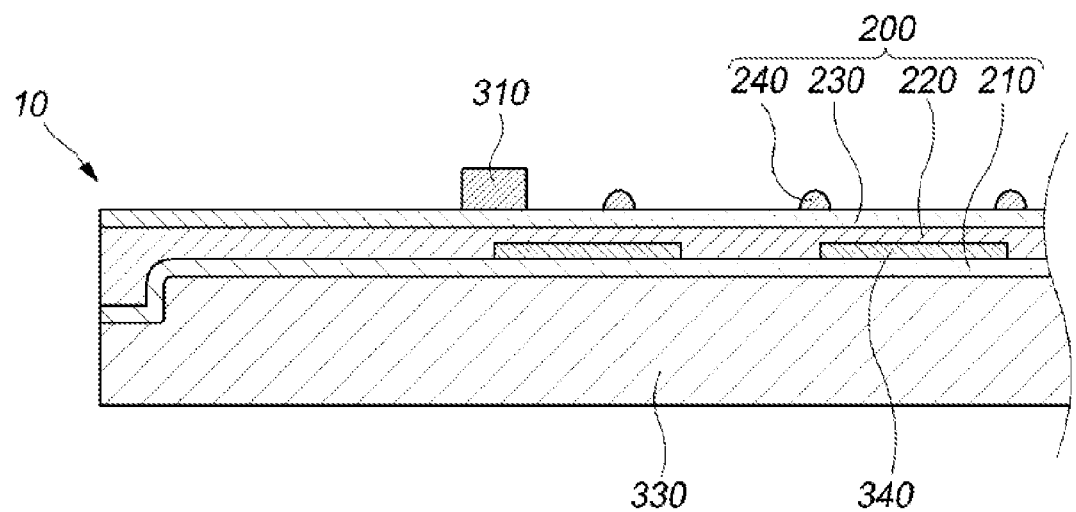

[Fig. 5]
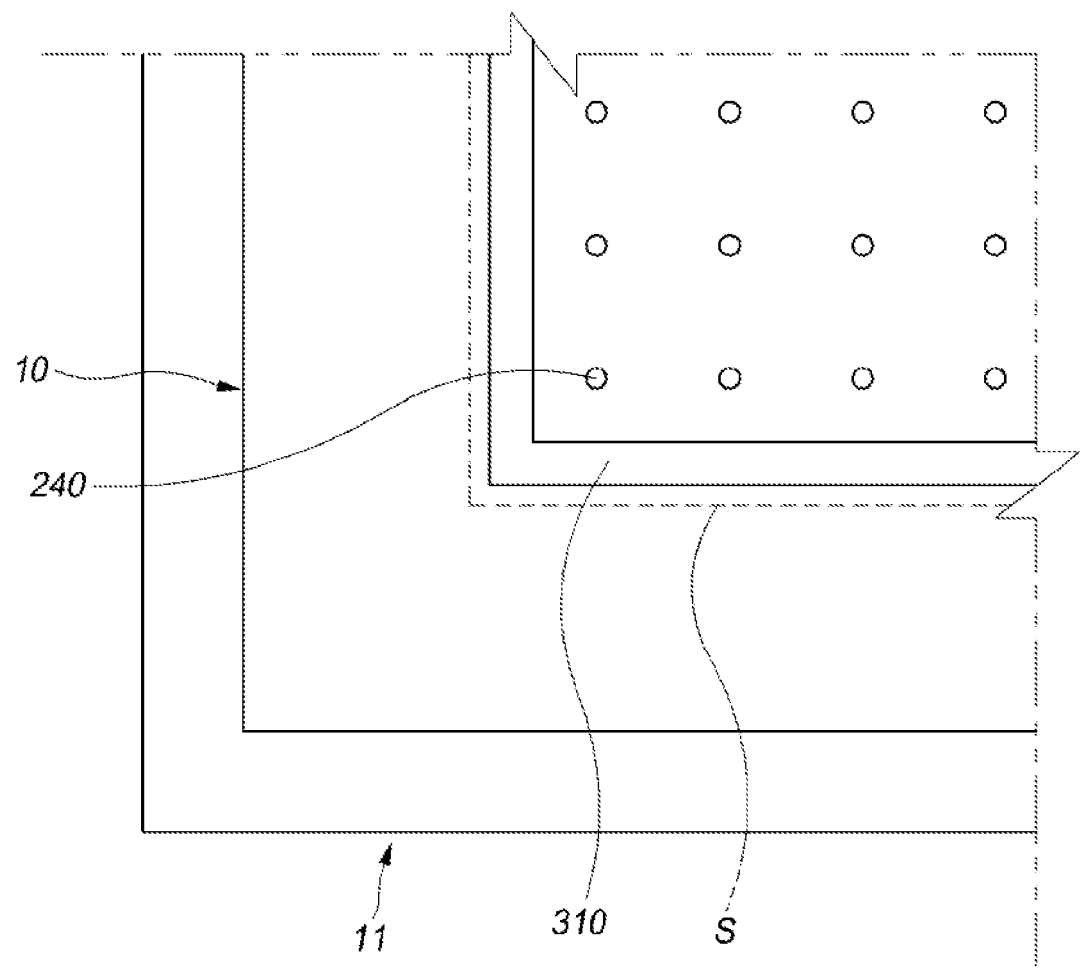

[Fig. 6A]
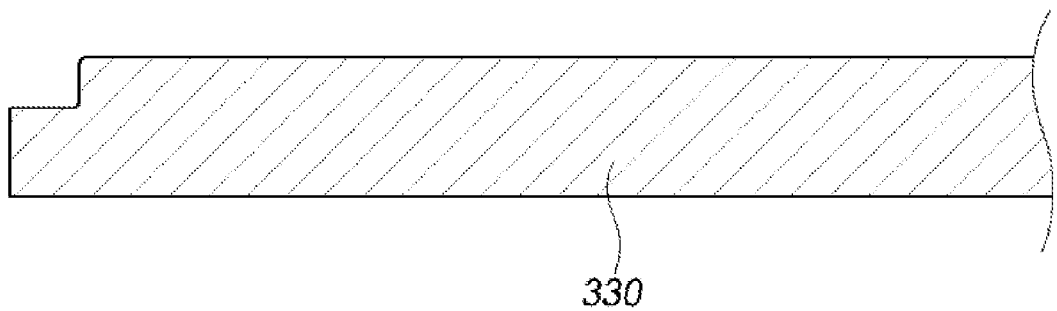
[Fig. 6B]
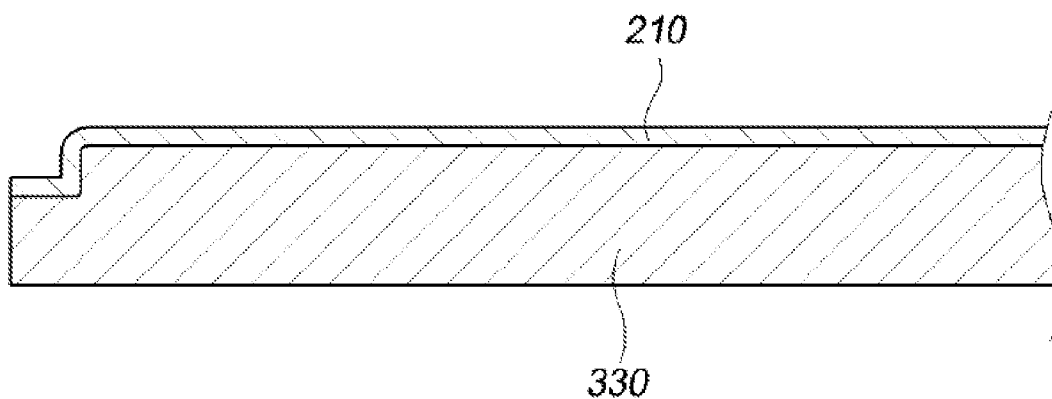
[Fig. 6C]
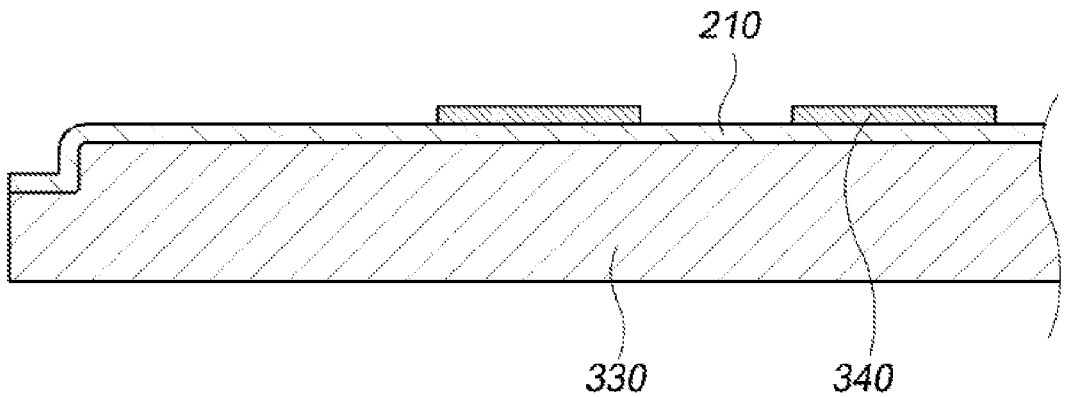

[Fig. 6D]
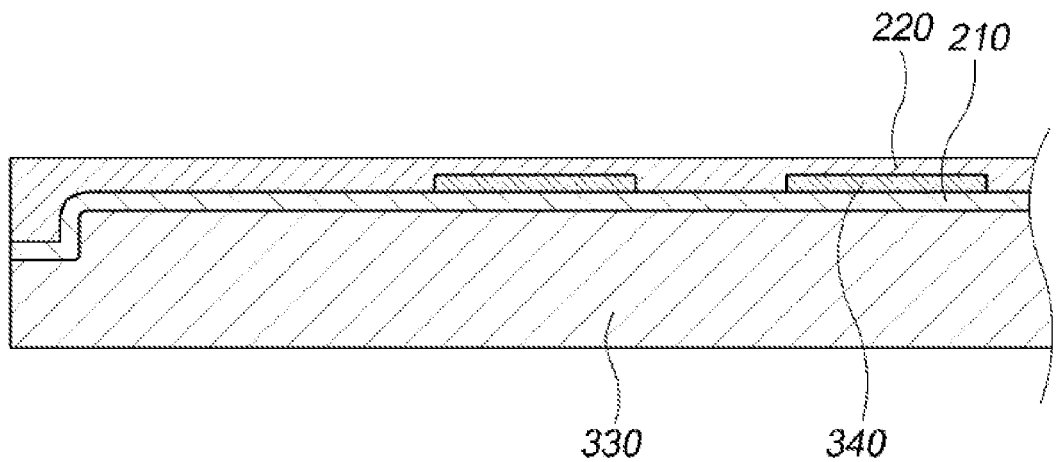
[Fig. 6E]
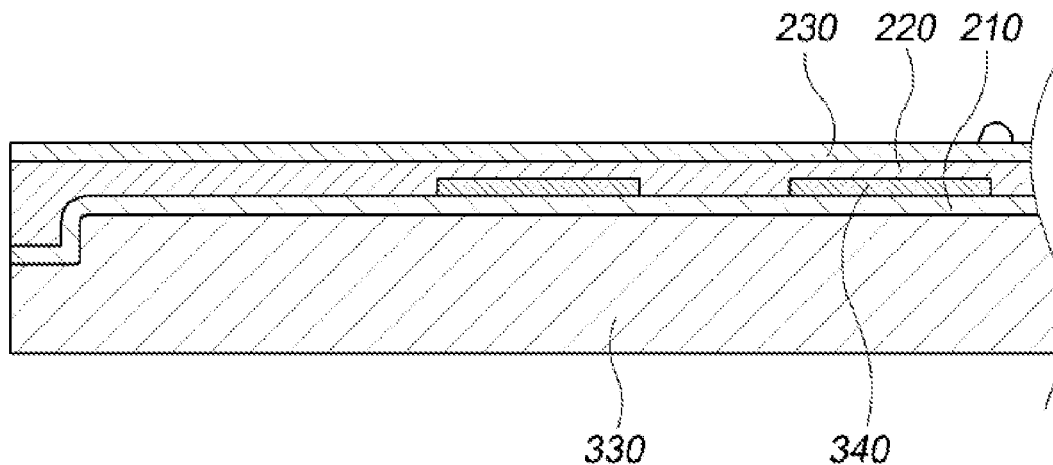

[Fig. 6F]
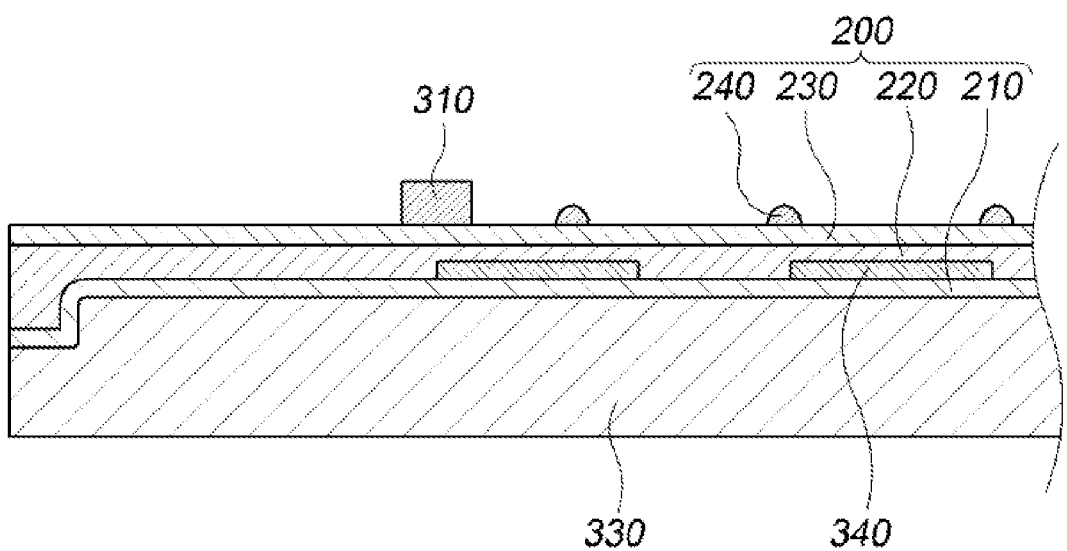

ELECTROSTATIC CHUCK AND MANUFACTURING METHOD THEREFOR

TECHNICAL FIELD

The present disclosure relates to a substrate processing apparatus, and more particularly, to an electrostatic chuck for fixing a substrate by an electrostatic force in a substrate processing apparatus and a method of manufacturing the electrostatic chuck.

BACKGROUND ART

An electrostatic chuck is used as a means for attracting and holding a substrate to be processed such as a semiconductor substrate, an LCD substrate, or an OLED substrate in a process chamber configured to perform therein substrate processing such as etching, CVD, sputtering, ion implantation, ashing, or vapor deposition.

As illustrated in FIG. 1, in the structure of a conventional electrostatic chuck disclosed in Patent Documents 1 and 2, a dielectric layer 103 holding electrodes 102 therein is bonded and integrated to a metal plate 100 via an organic adhesive 101 such as a silicone resin.

As a method of embedding the electrodes 102 in the dielectric layer 103, a method is employed in which the electrodes (tungsten) are printed on the surface of a ceramic green sheet, which is to be turned into a dielectric layer through firing, and firing (hot pressing) is performed after further stacking a separate ceramic green sheet thereon.

Meanwhile, in the case of an electrostatic chuck used in a substrate processing apparatus for processing a large-area substrate, due to cost and technical problems caused by the enlargement of area, as another method of manufacturing an electrostatic chuck, the dielectric 103 and the electrodes 102 may be formed using a plasma spraying method as disclosed in Patent Document 6.

However, when the dielectric 103 and the electrodes 102 are formed through a plasma spraying method, there is a problem that a voltage resistance characteristic is poor due to the formation of voids or the like, the life is short, and the attractive force is lowered.

In addition, in the case where substrate processing is performed in the state in which a mask is in close contact with the substrate, the accuracy of substrate processing is affected by the close contact state of the mask with respect to the substrate.

In particular, when the substrate is in close contact with the bottom surface of the carrier as in a vapor deposition method, the degree of adhesion of the substrate and the mask is lowered due to sagging of the mask, which makes it difficult to process the substrate precisely.

Patent Document 1: Japanese Utility Model Laid-open Publication No. Hei 4-133443
Patent Document 2: Japanese Patent Laid-Open Publication No. Hei 10-223742
Patent Document 3: Japanese Patent Laid-Open Publication No. 2003-152065
Patent Document 4: Japanese Patent Laid-Open Publication No. 2001-338970
Patent Document 5: Korean Patent No. 10-0968019
Patent Document 6: Korean Patent No. 10-0982649

DETAILED DESCRIPTION OF THE INVENTION

Technical Problem

A first aspect of the present disclosure is to provide an electrostatic chuck, in which the adhesion of a substrate to the electrostatic chuck at the edges of the substrate is increased so as to prevent foreign matter such as particles from entering between the substrate and the electrostatic chuck, thereby minimizing process failure and significantly increasing the maintenance cycle of the electrostatic chuck, and to provide a method of manufacturing the electrostatic chuck.

A second aspect of the present disclosure is to provide an electrostatic chuck, in which by forming the dielectric layer of the electrostatic chuck through a sol-gel method, the porosity of the dielectric layer is lowered, thereby prolonging the life of the electrostatic chuck and the dielectric constant is improved, thereby improving the attraction force for the substrate, and to provide a method of manufacturing the electrostatic chuck.

A third aspect of the present disclosure is to provide an electrostatic chuck, in which, in performing substrate processing in the state in which a mask is in close contact with the substrate, the mask is brought into close contact with the substrate by the magnetic force of the electrostatic chuck, thereby improving the adhesion to the mask and the substrate so that uniformity in a process and a shadow effect at an edge portion of the mask can be improved, and to provide a method of manufacturing the electrostatic chuck.

Technical Solution

According to an aspect of the present disclosure, in order to solve the problems described above, an electrostatic chuck according to the present disclosure is an electrostatic chuck 10 of a substrate processing apparatus that performs substrate processing in a state in which a mask M is in close contact with a top surface of a substrate S that is fixedly attracted to the electrostatic chuck 10, and is characterized in that the electrostatic chuck 10 includes a base member 330 made of a metal, and a dielectric layer 200 disposed on a top surface of the base member 330 and having therein an electrode layer 340, to which DC power is applied, in which an edge support portion 310 configured to support a bottom surface of an edge of the substrate S is disposed on a top surface of the dielectric layer 200.

According to an aspect of the present disclosure, an electrostatic chuck according to the present disclosure is an electrostatic chuck 10 of a substrate processing apparatus that performs substrate processing in a state in which a mask M is in close contact with a top surface of a substrate S that is fixedly attracted to the electrostatic chuck 10, and is characterized in that the electrostatic chuck 10 includes a base member 330 made of a metal; and a dielectric layer 200 disposed on a top surface of the base member 330 and having therein an electrode layer 340, to which DC power is applied, in which an edge support portion configured to support an edge of a bottom surface of the mask M is formed on a top surface of the dielectric layer 200.

According to an embodiment, the electrostatic chuck 10 may be further provided with a magnet 12 that brings the mask M into close contact with the top surface of the substrate S by magnetic force so as to further improve the adhesion of the mask M to the substrate S.

According to an embodiment, the mask M may include a mask sheet 31 having at least one opening 33 formed in a preset pattern, and an outer frame 32 supporting the edge of the mask sheet 31, and the magnet may bring the outer frame 32 into close contact with the top surface of the electrostatic chuck 10 by a magnetic force.

According to an embodiment, the electrostatic chuck 10 may be further provided with a carrier frame 11 coupled to an edge thereof so as to form a carrier that transfers a substrate S in a substrate processing system that performs substrate processing in the state in which the substrate S is fixedly attracted thereto.

According to an embodiment, the dielectric layer 200 may be formed from a ceramic material through at least one of a plasma spraying method and a sol-gel method.

In particular, it is desirable that the dielectric layer 200 be formed from a ceramic material through a sol-gel method, and it is more desirable that the dielectric layer 200 be formed through a combination of a plasma spraying method and a sol-gel method.

When the dielectric layer 200 is formed through the sol-gel method, it is possible to improve the voltage resistance characteristic and to prolong the lifetime by lowering the porosity and increasing the dielectric constant, thereby improving the attraction force to the substrate S.

According to a specific embodiment, the dielectric layer 200 may include a first dielectric layer 210 formed on the top surface of the base member 330 through a plasma spraying method and a second dielectric layer 220 formed through the sol-gel method after the electrode layer 340 is formed on the first dielectric layer 210, and the edge support portion 310 may be formed through a plasma spraying method after the second dielectric layer 220 is formed.

In addition, a third dielectric layer may be further formed on the top surface of the second dielectric layer 220 through a plasma spraying method after the second dielectric layer 220 is formed.

That is, according to another aspect of the present disclosure, a method of manufacturing an electrostatic chuck according to the present disclosure having the above-described structure is characterized in that the dielectric layer 200 is formed from a ceramic material through a sol-gel method.

Specifically, the dielectric layer 200 may be formed from a ceramic material through at least one of a plasma spraying method and a sol-gel method.

In particular, the dielectric layer 200 may be formed from a ceramic material through a sol-gel method, and it is desirable that the dielectric layer 200 be formed through a combination of a plasma spraying method and a sol-gel method.

When the dielectric layer 200 is formed through the sol-gel method, it is possible to improve the voltage resistance characteristic and to prolong the lifetime by lowering the porosity and increasing the dielectric constant, thereby improving the attraction force to the substrate S.

Meanwhile, the ceramic material may include any one of $Al_2O_3$, $Y_2O_3$, $ZrO_2$, $MgO$, $SiC$, $AlN$, $Si_3N_4$, and $SiO_2$.

According to a specific embodiment, a method of manufacturing the electrostatic chuck according to the present disclosure may include a first dielectric layer forming step of forming the first dielectric layer 210 on the top surface of the base member 330 through a plasma spraying method, a second dielectric forming step of forming the second dielectric layer 220 through a sol-gel method after forming the electrode layer 340 on the first dielectric layer 210, and a support portion forming step of forming the edge support portion 310 through a plasma spraying method after forming the second dielectric layer 220.

A third dielectric forming step of forming a third dielectric layer 230 on the top surface of the second dielectric layer 220 through a plasma spraying method may be included between the second dielectric layer 220 forming step and the support portion forming step.

Advantageous Effects

According to an aspect of the present disclosure, the adhesion of a substrate to the electrostatic chuck at the edges of the substrate is increased so as to prevent foreign matter such as particles from entering between the substrate and the electrostatic chuck, thereby minimizing process failure and significantly increasing (about 10 times or more) the maintenance cycle of the electrostatic chuck.

Specifically, the edge support portion that supports the edge of the substrate is formed to be higher than the height of the inner protrusions, thereby ensuring the close contact state in the edge of the substrate, so that foreign matter such as particles can be prevented from flowing into a gap between the substrate and the electrostatic chuck.

In addition, a mask support portion that is brought into close contact with the bottom surface of the mask is formed on the electrostatic chuck to be higher than the height of the inner protrusions, thereby ensuring the close contact state between the bottom surface of the mask and the mask support portion, so that foreign matter such as particles can be prevented from flowing into a gap between the substrate and the electrostatic chuck.

According to another aspect of the present disclosure, by forming the dielectric layer of the electrostatic chuck through a sol-gel method, it is possible to lower the porosity of the dielectric layer so as to prolong the lifetime and to increase the dielectric constant so as to improve the attraction force with respect to the substrate.

More preferably, by combining a layer formed by a plasma spraying method on the dielectric layer and a layer formed by a sol-gel method, a layer having a high porosity is formed by the sol-gel method and the mechanical rigidity is increased and the porosity of the dielectric layer is lowered by the plasma spraying method, so that the mechanical strength can be secured while the lifetime is prolonged.

According to another aspect of the present disclosure, in performing substrate processing in the state in which a mask is in close contact with the substrate, the mask is brought into close contact with the substrate by the magnetic force of the electrostatic chuck, thereby improving the adhesion to the mask and the substrate so that uniformity in a process and a shadow effect in the edge portion of the mask can be improved.

Specifically, when the mask is not in close contact with the substrate, the precision of the deposition is lowered due to an error occurring in the formation of the deposition material that has passed through the opening of the mask. However, the present disclosure is capable of maintaining a good adhesion state between the mask and the substrate.

BRIEF DESCRIPTION OF THE DRAWINGS

FIG. 1 is a cross-sectional view illustrating an electrostatic chuck according to a conventional technique;

FIG. 2A is a partial cross-sectional view illustrating a carrier on which an electrostatic chuck according to an embodiment of the present disclosure is installed and to which a mask is coupled;

FIG. 2B is a partial cross-sectional view illustrating an embodiment in which an outer frame of the mask is brought into close contact with an edge support portion as a modification of FIG. 2A;

FIG. 3 is a partial cross-sectional view illustrating a height difference between the edge support portion and protrusions in FIG. 2A or 2B;

FIG. 4 is a partial cross-sectional view illustrating an electrostatic chuck according to an embodiment of the present disclosure;

FIG. 5 is a partial plan view illustrating the electrostatic chuck according to the embodiment of the present disclosure; and FIGS. 6A to 6F are sectional views illustrating an embodiment of a method of manufacturing an electrostatic chuck according to an embodiment of the present disclosure.

MODE FOR CARRYING OUT THE INVENTION

Hereinafter, embodiments of the present disclosure will be described with reference to the accompanying drawings. FIG. 1 is a cross-sectional view illustrating an electrostatic chuck according to a conventional technique, FIG. 2A is a partial cross-sectional view illustrating a carrier on which an electrostatic chuck according to an embodiment of the present disclosure is installed and to which a mask is coupled, FIG. 2B is a partial cross-sectional view illustrating an embodiment in which an outer frame of the mask is brought into close contact with an edge support portion as a modification of FIG. 2A, FIG. 3 is a partial cross-sectional view illustrating a height difference between the edge support portion and protrusions in FIG. 2A or 2B, FIG. 4 is a partial cross-sectional view illustrating an electrostatic chuck according to an embodiment of the present disclosure, FIG. 5 is a partial plan view illustrating the electrostatic chuck according to the embodiment of the present disclosure, and FIGS. 6A to 6F are sectional views illustrating an embodiment of a method of manufacturing an electrostatic chuck of FIG. 4 according to an embodiment of the present disclosure.

An electrostatic chuck according to an embodiment of the present disclosure is an electrostatic chuck 10 of a substrate processing apparatus that performs substrate processing in the state in which a mask M is in close contact with the top surface of a substrate S that is fixedly attracted thereto.

A substrate processing apparatus using the electrostatic chuck according to the embodiment of the present disclosure includes a substrate processing apparatus such as a Chemical Vapor Deposition (CVD) apparatus, a sputtering apparatus, an ion implanting apparatus, an etching apparatus, or a vapor deposition apparatus.

Specifically, the electrostatic chuck according to an embodiment of the present disclosure is used in an apparatus that performs a process under a very low pressure atmosphere compared with atmospheric pressure.

The electrostatic chuck according to an embodiment of the present disclosure is preferably used in an apparatus that manufactures a substrate such as an OLED substrate, in particular a vapor deposition apparatus, in which a deposition layer is formed on a substrate by an evaporation material evaporated from an evaporation source.

The electrostatic chuck according to the embodiment of the present disclosure is a component for generating an electrostatic force for attracting and fixing a substrate S, and may be variously configured.

According to an embodiment, the electrostatic chuck may include a base member 330 made of a metal, a dielectric layer 200 formed on the top surface of the base member 330 and having an electrode layer 340 to which DC power is applied.

The base member 330 is a component that is made of a metal such as aluminum or stainless steel so as to secure mechanical rigidity, and may have various materials and structures according to the use conditions thereof.

The dielectric layer 200 is a component that is disposed on the top surface of the base member 330 and has therein an electrode layer 340, to which DC power is applied.

The electrode layer 340 is a component that is formed of a material such as tungsten inside the dielectric layer 200 and is electrically connected to a DC power source so as to generate static electricity by a combination with the dielectric layer 340 when the DC power is applied thereto.

The electrode layer 340 may be formed by various methods such as a plasma spraying method.

One or more electrode layers 340 may be formed depending on the attraction method of a substrate S and may have various structures such as a bi-polar structure and a uni-polar structure.

The dielectric layer 200 is a component having a dielectric constant so as to generate an electrostatic force when DC power is applied to the electrode layer 340. The dielectric layer 200 may be formed from a ceramic material through at least one of a plasma spraying method and a sol-gel method.

Here, the ceramic material may have a material such as $Al_2O_3$, $Y_2O_3$, $ZrO_2$, $MgO$, $SiC$, $AlN$, $Si_3N_4$, $SiO_2$, or the like.

When the substrate S is not in close contact with the electrostatic chuck 10 during the substrate processing process, particles may flow into the gap between the substrate S and the top surface of the electrostatic chuck 10 and may contaminate the rear surface of the substrate S, which may result in a defect in substrate processing.

Thus, it is desirable that the substrate S be in close contact with the electrostatic chuck 10. To this end, as illustrated in FIG. 2, the electrostatic chuck 10 may include, on the top surface of the dielectric layer 200, an edge support portion 310 that supports the bottom surface of the edge of the substrate S and a plurality of protrusions 240 having a second height $H_2$ lower than a first height $H_1$ of the edge support portion 310.

The edge support portion 310 is a component that supports the bottom surface of the edge of the substrate S, and may be formed on the top surface of the dielectric layer 200 through a plasma spraying method or the like when the dielectric layer 200 is formed.

The edge support portion 310 is formed on the top surface of the electrostatic chuck 10 as a closed curve in the form of a rectangle or the like corresponding to the edge of the substrate S, as illustrated in FIG. 5.

At this time, the first height $H_1$ of the edge support portion 310 is formed to be higher than the second height $H_2$ of the protrusions 240 formed on the inner side so as to support the bottom surface of the edge of the substrate S.

As illustrated in FIG. 2A, due to the formation of the edge support portion 310, the edge of the substrate S is flexed and supported on the edge support portions 310, so that the particles can be prevented from flowing into or out from the edge support portion 310 as a boundary.

Specifically, it is possible to prevent the particles from flowing toward the substrate S from the outside of the edge support portion 310 toward the substrate S while preventing the particles from flowing out to the outside of the edge support portion 310 from the substrate S side, so that the particles can be prevented from leaking to the carrier frame 11 on the outer side of the edge support portion 310.

Meanwhile, the plurality of protrusions 240 are components that are selectively formed on the top surface of the electrostatic chuck 10 such that the substrate S is spaced apart from the top surface of the electrostatic chuck 10, and may be selectively formed depending on the type of the substrate processing.

When the plurality of protrusions 240 are not formed on the electrostatic chuck 10, the first height $H_1$ of the edge supporting portion 310 may be formed at an appropriate height in a range where the substrate S is not damaged.

Meanwhile, in the embodiment of FIG. 2A, the edge support portion 310 is described as supporting the bottom surface of the substrate S, as an example. However, the edge support portion 310 may be formed so as to support the bottom surface of the mask M, as illustrated in FIG. 2B.

The embodiment illustrated in FIG. 2B is the same as that illustrated in FIG. 2B except that the bottom surface of the mask M is supported and thus a detailed description thereof will be omitted.

In the embodiment illustrated in FIG. 2B, the end portion of the edge of the substrate S may be located inside the edge support portion 310.

Thus, it is possible to prevent the particles from flowing toward the substrate S from the outside of the edge support portion 310 toward the substrate S while preventing the particles from flowing out to the outside the edge support portion 310 from the substrate S side, so that the particles can be prevented from leaking to the carrier frame 11 on the outer side of the edge support portion 310.

Meanwhile, the dielectric layer 200 is generally formed through a plasma spraying method in order to process a large-sized substrate in the prior art. When the dielectric layer 200 is formed through the plasma spraying method, the dielectric layer 200 has high porosity because voids are formed therein, which results in a poor voltage resistance characteristic, a short life time, and a short maintenance cycle. Further, the dielectric layer has a low dielectric constant, and thus attraction force to the substrate S is low.

In view of this, according to an embodiment of the present disclosure, the dielectric layer 200 may be formed of a ceramic material through a sol-gel method, or may be formed through a combination of a plasma spraying method and a sol-gel method.

In particular, when the dielectric layer 200 is formed through the sol-gel method, it is possible to improve the voltage resistance characteristic and to prolong the lifetime by lowering the porosity and increasing the dielectric constant, thereby improving the attraction force to the substrate S.

A well-known sol-gel method may be used as the sol-gel method of forming the dielectric layer 200, for example, through the following steps.

1) hydrolysis reaction or reaction with alcohols (hydrolysis)

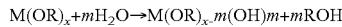

$M(OR)_x + mH_2O \rightarrow M(OR)_{x-m}(OH)_m + mROH$ 2) water condensation (condensation)

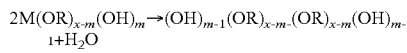

$2M(OR)_{x-m}(OH)_m \rightarrow (OH)_{m-1}(OR)_{x-m}(OR)_{x-m}(OH)_{m-1} + H_2O$ 2') alcohol condensation

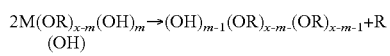

$2M(OR)_{x-m}(OH)_m \rightarrow (OH)_{m-1}(OR)_{x-m}(OR)_{x-m-1} + R(OH)$

Meanwhile, in the method of forming the dielectric layer of the electrostatic chuck, the sol-gel method is able to produce a homogeneous inorganic oxide material having good properties in hardness, transparency, chemical stability, controlled porosity, thermal conductivity, and the like at room temperature.

A special method was applied, which was capable of obtaining a single monolith, a thin film, and powder having a single grain size through shaping into various shapes in a gel state by the application of the sol-gel method described above.

Through this method, it was possible to produce a protective film, a porous film, a window insulator, a dielectric material, and an electromagnetic material coating, and it was possible to achieve a remarkable performance improvement in the electrostatic chuck 10.

In synthesis using the sol-gel method, a gel may be synthesized by measuring a particle size distribution caused due to a PH change through the synthesis of alumina, and selecting the Ph when the particle size is the smallest.

Meanwhile, after shaping through the sol-gel method, sintering may be performed at a relatively low temperature such as 150° C.

According to a specific embodiment, the dielectric layer 200 may include a first dielectric layer 210 formed on the top surface of the base member 330 through a plasma spraying method and a second dielectric layer 220 formed through the sol-gel method after the electrode layer 340 is formed on the first dielectric layer 210, and the edge support portion 310 and the protrusions 240 may be formed through a plasma spraying method after the second dielectric layer 220 is formed.

Here, the first dielectric layer 210 may also be formed through the sol-gel method instead of the plasma spraying method.

Meanwhile, a third dielectric layer 230 may be further formed on the top surface of the second dielectric layer 220 through a plasma spraying method after the formation of the second dielectric layer 220.

By forming the third dielectric layer 230, the mechanical rigidity can be secured in addition to the second dielectric layer 220 formed through the sol-gel method.

According to an embodiment, the electrostatic chuck according to an embodiment of the present disclosure is a component that attracts and fixes the substrate S, and may be used as a carrier itself or a part of the configuration thereof that moves in a substrate processing apparatus such as an evaporation deposition apparatus.

The carrier is a component that includes the electrostatic chuck so as to be moved in the state in which the substrate S is fixedly attracted thereto.

The carrier may have a variety of structures depending on a movement method or the like in the substrate processing apparatus.

The carrier may be moved in various methods. For example, in the case of a vapor deposition apparatus, the carrier may be moved in the state in which the substrate S is fixed to the bottom surface thereof so as to face downwards, or in the state in which the carrier is in a vertical or inclined state such that the substrate S faces a lateral side.

For this embodiment, the electrostatic chuck 10 is further provided with a carrier frame 11 coupled to an edge thereof so as to form a carrier that transfers a substrate S in a substrate processing system that performs substrate processing in the state in which the substrate S is fixedly attracted thereto.

Meanwhile, a substrate processing process may be performed in the state in which the substrate S is in close contact with a mask M.

The mask M is a component that is in close contact with a substrate S so as to form a deposition film on the substrate S in a pre-designed pattern, and may have various configurations including a sheet 31 that is provided with one or more openings 33.

According to an embodiment, the mask M may include a mask sheet 31 having at least one opening 33 formed in a preset pattern, and an outer frame 32 supporting the edge of the mask sheet 31.

Depending on processes, the mask M may be variously configured as a Fine Metal Mask (FMM) having openings in the unit of a pixel, an open mask maintained in the state of being in close contact with the substrate S, or the like.

According to an embodiment in which it is desirable that the mask M be maintained in the close contact state on the substrate S as much as possible, the electrostatic chuck 10 may be further provided with a magnet 12 that brings the mask M into close contact with the top surface of the substrate S by magnetic force so as to further improve the adhesion of the mask M to the substrate S.

The magnet 12 is a component that is constituted by a permanent magnet or the like and provided on the electrostatic chuck 10 so as to bring the mask M into close contact with the top surface of the substrate S by the magnetic force, and may be installed at a proper position.

The adhesion of the mask M to the substrate S at the edge of the substrate S can be improved by the magnet 12, so that the uniformity of the process and the shadow effect at the edge of the substrate S can be improved.

According to an embodiment, the magnet 12 may be installed on the bottom surface of the base member 330 constituting the electrostatic chuck 10.

When the mask M includes an outer frame 32, the magnet 12 is capable of bringing the outer frame into close contact with the top surface of the electrostatic chuck 10 by the magnetic force.

Here, it is desirable that the mask sheet 31 of the mask M be in close contact with the substrate S, and thus it is desirable that the magnet 12 be positioned so as to bring the mask sheet 31 into close contact with the top surface of the electrostatic chuck 10 by the magnetic force.

Meanwhile, another gist of the present disclosure is to form a dielectric layer of an electrostatic chuck by the sol-gel method or a combination of a plasma spraying method and a sol-gel method as described above.

That is, according to another aspect of the present disclosure, a method of manufacturing an electrostatic chuck according to the present disclosure having the above-described structure is characterized in that the dielectric layer 200 is formed from a ceramic material through a sol-gel method.

Specifically, the dielectric layer 200 may be formed from a ceramic material through a combination of a plasma spraying method and a sol-gel method.

In particular, it is desirable that that the dielectric layer 200 be formed from a ceramic material through a sol-gel method, and it is more desirable that the dielectric layer 200 be formed through a combination of a plasma spraying method and a sol-gel method.

When the dielectric layer 200 is formed through the sol-gel method, it is possible to improve the voltage resistance characteristic and to prolong the lifetime by lowering the porosity and increasing the dielectric constant, thereby improving the attraction force to the substrate S.

According to a specific embodiment, a method of manufacturing the electrostatic chuck according to the present disclosure may include a first dielectric layer forming step of forming the first dielectric layer 210 on the top surface of the base member 330 through a plasma spraying method, a second dielectric forming step of forming the second dielectric layer 220 through a sol-gel method after forming the electrode layer 340 on the first dielectric layer 210, and a support portion forming step of forming the edge support portion 310 and the protrusions 240 through a plasma spraying method after forming the second dielectric layer 220.

In addition, a third dielectric forming step of forming a third dielectric layer 230 on the top surface of the second dielectric layer 220 through a plasma spraying method is included between the second dielectric layer 220 forming step and the support portion forming step.

The invention claimed is:

1. An electrostatic chuck of a substrate processing apparatus that performs substrate processing in a state in which a mask (M) is in close contact with a top surface of a substrate (S) that is fixedly attracted to the electrostatic chuck, the electrostatic chuck comprising:
   a base member made of a metal; and
   a dielectric layer disposed on a top surface of the base member and having therein an electrode layer, to which DC power is applied, wherein an edge support portion configured to support a bottom surface of an edge of the substrate (S) is disposed on a top surface of the dielectric layer.

2. The electrostatic chuck of claim 1, further comprising a magnet configured to bring the mask (M) into close contact with a top surface of the substrate (S) by a magnetic force.

3. The electrostatic chuck of claim 2, wherein the mask (M) comprises a mask sheet having at least one opening formed in a preset pattern, and an outer frame configured to support an edge of the mask sheet, and the magnet brings the outer frame into close contact with the top surface of the substrate (S) by a magnetic force.

4. The electrostatic chuck of claim 1, wherein a carrier frame is additionally coupled to an edge of the electrostatic chuck so as to form a carrier that transfers the substrate (S) in a substrate processing system that performs substrate processing in a state in which the substrate (S) is fixedly attracted thereto.

5. The electrostatic chuck of a claim 1, wherein the dielectric layer is formed from a ceramic material through at least one of a plasma spraying method and a sol-gel method.

6. The electrostatic chuck of claim 1, wherein the dielectric layer comprises a first dielectric layer formed on the top surface of the base member through a plasma spraying method and a second dielectric layer formed through a sol-gel method after the electrode layer is formed on the first dielectric layer, and the edge support portion is formed through a plasma spraying method after the second dielectric layer is formed.

7. The electrostatic chuck of claim 6, wherein a third dielectric layer is further formed on a top surface of the second dielectric layer through a plasma spraying method after the second dielectric layer is formed.

8. A method of manufacturing the electrostatic chuck of claim 1, wherein the dielectric layer is formed from a ceramic material through a sol-gel method.

9. The method of manufacturing the electrostatic chuck of claim 8, wherein the dielectric layer is formed from a combination of a plasma spraying method and a sol-gel method.

10. The method of manufacturing the electrostatic chuck of claim 8, wherein the ceramic comprises at any one of $Al_2O_3$, $Y_2O_3$, $ZrO_2$, MgO, SiC, AlN, $Si_3N_4$, and $SiO_2$.

11. The method of manufacturing the electrostatic chuck of claim 8, wherein the method comprises:
   a first dielectric layer forming step of forming a first dielectric layer on the top surface of the base member through a plasma spraying method;

a second dielectric forming step of forming a second dielectric layer through a sol-gel method after forming an electrode layer on the first dielectric layer; and a support portion forming step of forming the edge support portion through a plasma spraying method after forming the second dielectric layer.

12. The method of manufacturing the electrostatic chuck of claim 11, wherein a third dielectric forming step of forming a third dielectric layer on the top surface of the second dielectric layer through a plasma spraying method is included between the second dielectric layer forming step and the support portion forming step.

13. An electrostatic chuck of a substrate processing apparatus that performs substrate processing in a state in which a mask (M) is in close contact with a top surface of a substrate (S) that is fixedly attracted to the electrostatic chuck, the electrostatic chuck comprising:

a base member made of a metal; and a dielectric layer disposed on a top surface of the base member and having therein an electrode layer, to which DC power is applied, wherein an edge support portion configured to support an edge of a bottom surface of the mask (M) is formed on a top surface of the dielectric layer.

* * * * *